US006934930B2

(12) United States Patent
Blatchford, Jr. et al.

(10) Patent No.: US 6,934,930 B2
(45) Date of Patent: Aug. 23, 2005

(54) GENERATING AN OPTICAL MODEL FOR LENS ABERRATIONS

(75) Inventors: James W. Blatchford, Jr., Richardson, TX (US); Lewis W. Flanagin, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 85 days.

(21) Appl. No.: 10/615,048

(22) Filed: Jul. 8, 2003

(65) Prior Publication Data

US 2005/0010878 A1 Jan. 13, 2005

(51) Int. Cl.[7] .............................................. G06F 17/50
(52) U.S. Cl. ........................................ 716/21; 716/19
(58) Field of Search ...................................... 716/21, 19

(56) References Cited

U.S. PATENT DOCUMENTS

| 5,362,585 A | * | 11/1994 | Adams | 430/30 |
| 6,437,858 B1 | * | 8/2002 | Kouno et al. | 356/124 |
| 2003/0088847 A1 | * | 5/2003 | Chang et al. | 716/19 |
| 2004/0167748 A1 | * | 8/2004 | Zhang et al. | 702/185 |

OTHER PUBLICATIONS

Dusa, "Effects of Lens Aberrations on Critical Dimension Control in Optical Lithography", Oct. 1997, IEEE CAS '97 Procedding International Semiconductor Conference, vol. 2, pp. 425–429.*

Harazaki et al., "High Accurate Optical Proximity Correction under the Influence of Lens Aberration in 0.15 um Logic Process", Jul. 2000, IEEE 2000 International Microprocesses and Nanotechnology Conference, pp. 14–15.*

Detje et al., "Exposure Tool Effects on OPC", Nov. 2002, IEEE 2002 International Microprocesses and Nanotechnology Conference, Digest of Papers, pp. 298.*

FringeSoft, Zernike and Seidel Polynomials, Zernike polynomials, http://www.fringesoft.com/siedel.htm; copyright 2000 FringeSoft; 2 pages, Jun. 28, 2000.

Gennari, Frank E., "*Validation of the aberration pattern–matching OPC strategy*," Design, Process Integration, and Characterization for Microelectronics, Alexander Starikov, Kenneth W. Tobin, Jr., Editors, Proceedings of SPIE vol. 4692, pp. 444–453, 2002.

Calibre OPC and PSM, Manufacturability Datasheet, "*Calibre OPC and PSM: Enabling Silicon Accuracy, Speed and Yield from 180nm to 65nm*," Mentor Graphics, Mentor Graphics Corporation, www.mentor.com/dsm, 6 pages, Apr. 2003.

* cited by examiner

*Primary Examiner*—Stacy A. Whitmore
*Assistant Examiner*—Sun James Lin
(74) *Attorney, Agent, or Firm*—Peter K. McLarty; W. James Brady, III; Frederick J. Telecky, Jr.

(57) ABSTRACT

Generating an optical model includes receiving lens aberration data associated with a wafer response to lens aberrations. Aberration functions are selected and fit to the lens aberration data. An optical model is generated in accordance to the aberration functions, where the optical model indicates the wafer response to the lens aberrations.

17 Claims, 2 Drawing Sheets

GENERATING AN OPTICAL MODEL FOR LENS ABERRATIONS

TECHNICAL FIELD OF THE INVENTION

This invention relates generally to the field of integrated circuits and more specifically to generating an optical model for lens aberrations.

BACKGROUND OF THE INVENTION

Exposure tools are used in photolithography to define patterns on objects such as semiconductor wafers. Exposure tools, however, may introduce errors that cause the resulting pattern defined on the object to differ from the intended pattern. Known techniques may generate optical models that may be used to compensate for errors introduced by exposure tools. The optical models generated by known techniques, however, may fail to provide information about certain errors. Consequently, known techniques for generating optical models may be unsatisfactory in certain situations.

SUMMARY OF THE INVENTION

In accordance with the present invention, disadvantages and problems associated with previous techniques for generating an optical model may be reduced or eliminated.

According to one embodiment of the present invention, generating an optical model includes receiving lens aberration data associated with a wafer response to lens aberrations. Aberration functions are selected and fit to the lens aberration data. An optical model is generated in accordance to the aberration functions, where the optical model indicates the wafer response to the lens aberrations.

Certain embodiments of the invention may provide one or more technical advantages. A technical advantage of one embodiment may be that an optical model may describe how a lens aberration of an exposure tool affects the pattern defined on a wafer. According to another embodiment, the optical model may be used to determine the sensitivity of a pattern design with respect to the lens aberrations of multiple exposure tools. According to yet another embodiment, the optical model may be used to adjust a pattern design to correct an error resulting from a lens aberration.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE INVENTION

Figure 1:
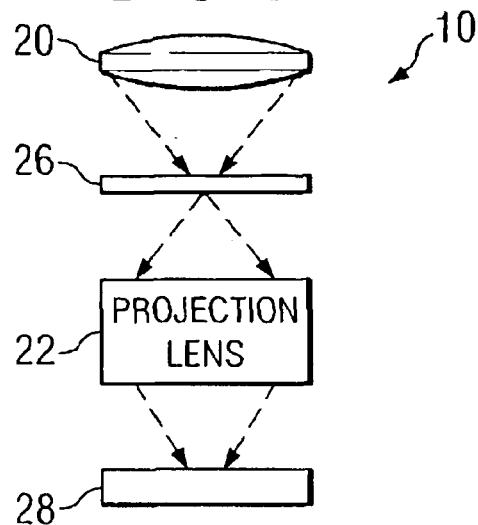
FIG. 1 is a diagram illustrating an example of an exposure tool that may be described by an optical model according to one embodiment of the present invention.
Figure 2:
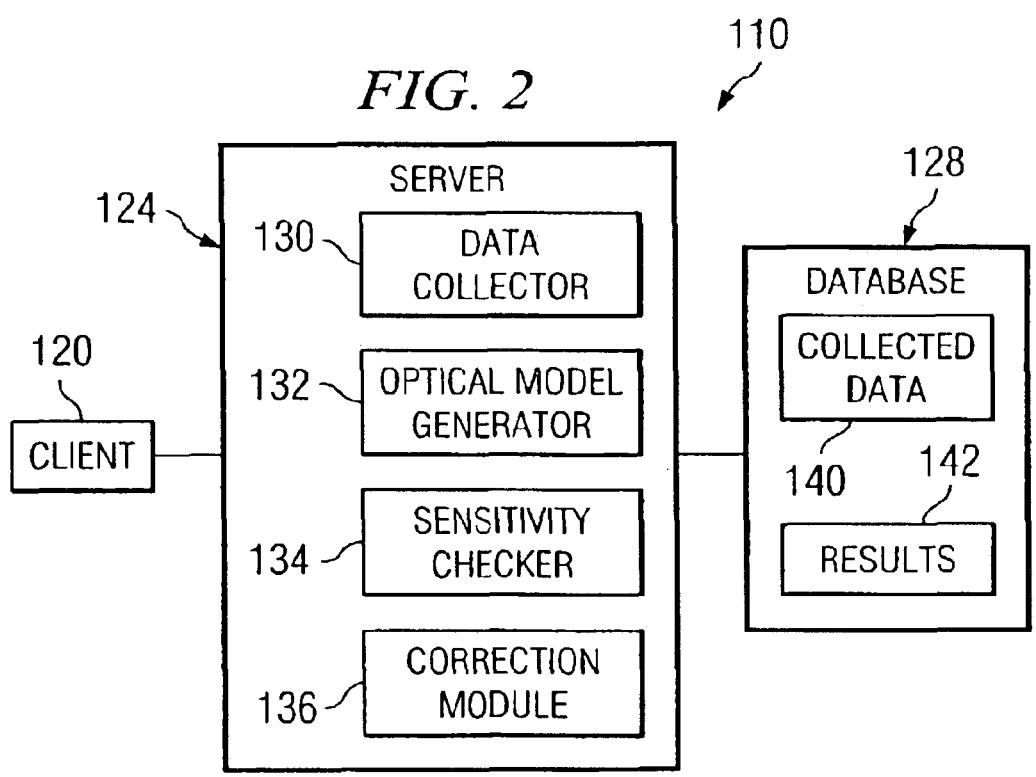
FIG. 2 is a block diagram of one embodiment of a system for generating an optical model.
Figure 3:
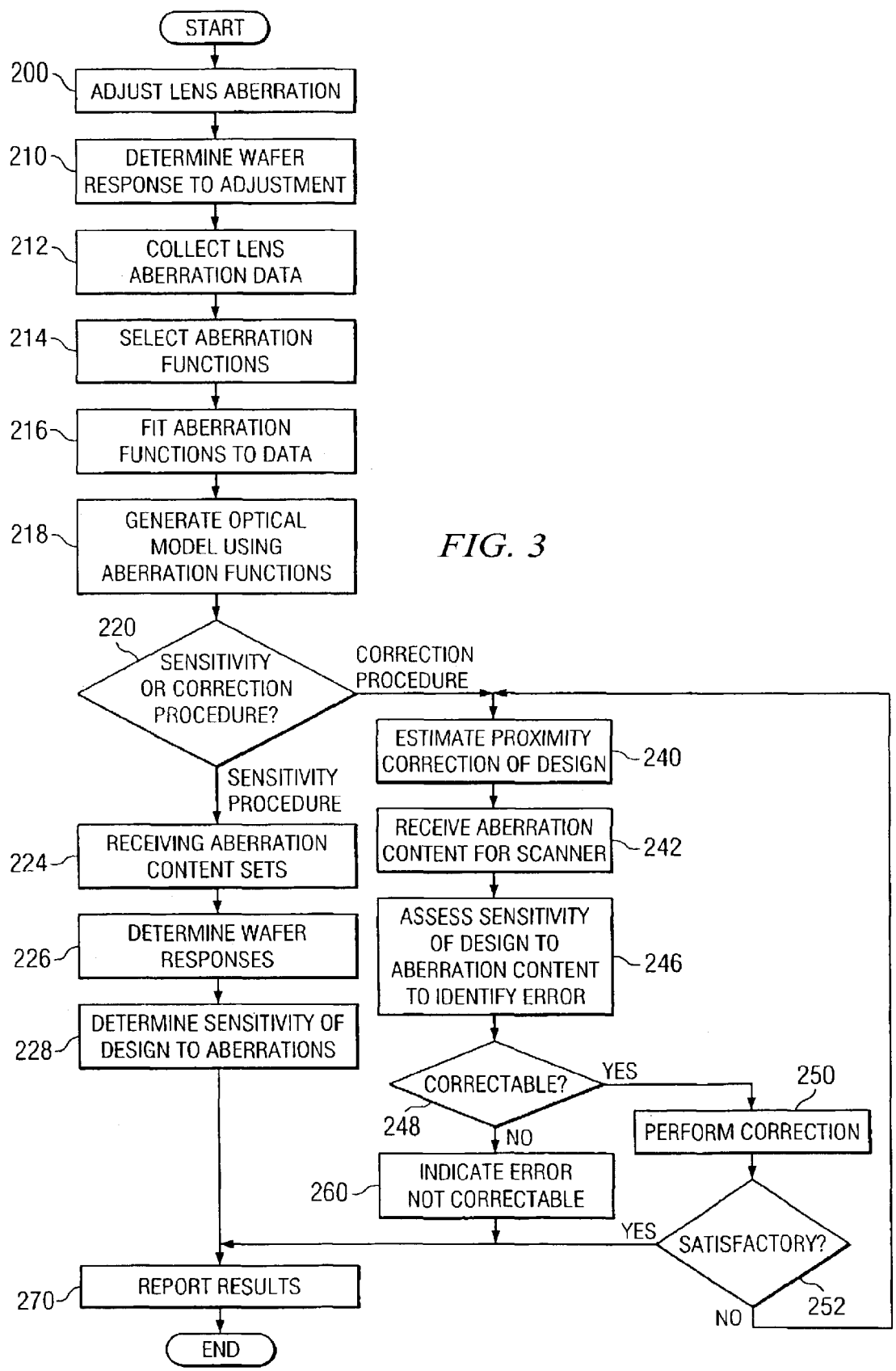
FIG. 3 is a flowchart illustrating one embodiment of a method for generating an optical model.

Embodiments of the present invention and its advantages are best understood by referring to FIGS. 1 through 3 of the drawings, like numerals being used for like and corresponding parts of the various drawings.

FIG. 1 is a diagram illustrating an example of an exposure tool 10 that may be described by an optical model according to one embodiment of the present invention. In general, exposure tool 10 directs light through a mask to create a pattern on a wafer. A projection lens of exposure tool 10, however, may have lens aberrations that introduce errors that cause the resulting pattern defined on the wafer to differ from the intended pattern.

According to the embodiment, an optical model may be used to describe how a lens aberration affects a pattern defined on a wafer. According to one embodiment, the optical model may be used to determine the sensitivity of a pattern design with respect to the lens aberrations of multiple exposure tools 10. According to another embodiment, the optical model may be used to adjust a pattern design to correct an error resulting from a lens aberration.

According to the illustrated embodiment, exposure tool 10 defines a pattern on a wafer 28 by directing light through a mask 26 to wafer 28. Wafer 28 may comprise any suitable semiconductor material, for example, silicon. Wafer 28 may also comprise a material on which a pattern may be formed, such as imaging material or photoresist, disposed outwardly from the semiconductor material. For data analysis purposes, wafer 28 may comprise a very flat double-polished wafer having a thickness of approximately 620 microns with a local thickness variation of less than 0.2 microns.

Exposure tool 10 includes an illumination source 20 and a projection lens 22, which are used with mask 26 to define a pattern on wafer 28. According to one embodiment, source 20 and projection lens 22 may be embodied in a scanner that illuminates a long, thin slit portion of wafer 28 parallel to an X direction, and then moves in a Y direction to illuminate a next slit portion of wafer 28 in order to define a pattern at locations (X,Y) of wafer 28.

Source 20 illuminates mask 26, and may comprise any device suitable for illuminating mask 26, for example, a laser or condenser optics. The illumination provided by source 20 may be described by an energy dose E(X). Characteristics such as the radiance distribution of source 20 may be described by a radiance function $J(X;\rho,\theta)$, where $\rho$ represents a radial direction, and $\theta$ represents an angular direction defined at the exit pupil of projection lens 22. Mask 26 defines the pattern to be formed at wafer 28, and may comprise any template suitable for defining a pattern such as a line and space grating pattern. Characteristics of mask 26 such as the two-dimensional design of the pattern may be represented by a mask function M(X,Y).

Projection lens 22 collects light diffracted from mask 26 and directs the light to wafer 28, and may comprise any device suitable for collecting diffracted light, for example, 4× reduction lens optics. A lens such as projection lens 22 may be associated with aberration content that describes one or more aberrations of the lens such as curvature or astigmatism. The aberrations may be described using one or more suitable aberration functions having forms, for example, $$\left(\sum_i c_i r^i\right) \cos(n\theta)$$

and $$\left(\sum_i C_i r^i\right) \sin(n\theta).$$

As an example, the aberration functions may comprise Zernike functions, which may be expressed according to Equation (1):

$$Z_n^m(\rho, \theta) = \begin{cases} N_n^m R_n^{|m|}(\rho)\cos m\theta; & \text{for } m \geq 0 \\ -N_n^m R_n^{|m|}(\rho)\sin m\theta; & \text{for } m < 0 \end{cases} \quad (1)$$

where $N_n^m$ is a normalization factor and $R_n^{|m|}(\rho)$ is given by Equation (2):

$$R_n^{|m|}(\rho) = \sum_{s=0}^{(n-|m|)/2} \frac{(-1)^s (n-s)!}{s![0.5(n+|m|-s)]![0.5(n-|m|-s)]!} \rho^{n-2s} \quad (2)$$

The resulting pattern formed at locations (X,Y) of wafer 28 may be described by an image function I(X,Y) defined using the energy dose E(X), radiance function J(X;θ,ρ), mask function M(X,Y), and aberration functions. Patterning may involve performing multiple exposure cycles using different masks. According to one embodiment, patterning a critical layer such as a gate may involve, for example, a two-mask double-expose process.

The resulting pattern may differ from the intended pattern that mask 26 is designed to define. For example, the resulting pattern may exhibit critical dimension errors. A critical dimension is a dimension that may be required to be defined with a high degree of accuracy. For example, the width of a transistor gate may be a critical dimension. The width may be required to be defined with an accuracy of, for example, five to seven nanometers.

Critical dimension errors may result from any of a number of factors, for example, lens aberrations of projection lens 22. According to one embodiment of the invention, an optical model that describes the response of wafer 28 to a lens aberration may be generated. The optical model may be used to determine the sensitivity of a design to lens aberrations and to correct an error due to lens aberrations.

Modifications, additions, or omissions may be made to exposure tool 10 without departing from the scope of the invention. Additionally, certain functions for characterizing exposure tool 10 may be performed using any suitable logic comprising software, hardware, other logic, or any suitable combination of the preceding.

FIG. 2 is a block diagram of one embodiment of a system 110 for generating an optical model. According to the embodiment, system 110 generates an optical model that describes the response of the imaging material of a wafer, or a wafer response, to a lens aberration. System 110 may collect lens aberration data that describe lens aberrations, fit lens aberration functions to the lens aberration data, and generate an optical model in accordance to the lens aberration functions.

According to the illustrated embodiment, system 110 includes a client 120, a server 124, and a database 128 coupled as shown in FIG. 2. According to one embodiment, client 120 allows a user to communicate with server 124 to generate an optical model, and database 128 stores information used by server 124. Server 124 manages applications for generating an optical model such as a data collector 130, an optical model generator 132, a sensitivity checker 134, and a correction module 134.

Data collector 130 may be used to collect data from exposure tool 10 in order to determine how a wafer 28 responds to changes in the lens aberrations of projection lens 22. As an example, data collector 130 may collect data by moving the lens elements of projection lens 22 to change the lens aberrations. The lens elements may be moved using, for example, piezoelectric actuators. Wafer 28 may be exposed using projection lens 22, and may be analyzed in order to determine the response of wafer 28 to the lens aberration of projection lens 22. The response may be measured using a scanning electron microscope, and may comprise, for example, critical dimension response line end truncation, pattern placement error, other types of response, or any combination of the preceding responses. Lens aberration data that describes the response may be generated.

Optical model generator 132 generates an optical model that describes wafer response to lens aberrations. As an example, the optical model may be used to determine the response at a particular location (X,Y) of wafer 28 given an aberration at a particular location (X',Y') of projection lens, where the aberration itself may spread across a portion or all of projection lens 22. Values such as Zernike coefficients may describe the imaging at the wafer location. Given the coefficients and pattern data, the optical model may be used to generate a predicted change such as a critical dimension change as output.

According to one embodiment, optical model generator 132 may generate an optical model using lens aberration data received from data collector 130. Optical model generator 132 may select lens aberration functions such as one or more Zernike functions to describe the lens aberrations, and adjust the coefficients of the selected aberration functions to fit the functions to the lens aberration data.

Optical model generator 132 may then generate an optical model using the lens aberration functions. The optical model may include the lens aberration functions and may include functions that describe how other features of exposure tool 10 affect the response of wafer 28. As an example, the other features may include the exposure wavelength, the numerical aperture of the scanner, the source width of the scanner, the demagnification of the scanner, the defocus of the scanner, the standard deviation of the Gaussian diffusion kernel, the binary mask type definition, the proportion of total energy and binary exposure, other suitable features, or any combination of the preceding features.

Sensitivity checker 134 may be used to determine the sensitivity of a design of a pattern with respect to a number of exposure tools 10. For example, sensitivity checker 134 may determine whether a critical dimension varies too much from one exposure tool 10 to another exposure tool 10. Sensitivity checker 134 may determine the sensitivity by simulating the wafer response using the optical model generated by optical model generator 132.

As an example, sensitivity checker 134 may receive aberration content sets, where each set describes the lens aberrations of a projection lens 22 of a particular exposure tool 10. Alternatively, each set may describe the lens aberrations across the lens field of projection lens 22. An aberration content set may include values such as Zernike coefficients that describe aberrations at locations of projection lens 22. Zernike coefficients may be reported in units of wavelength, for example, 15 to 20 "milli-lambda", that is, 0.015 to 0.02 times the exposure wavelength.

The optical model may be used to determine the response at locations (X,Y) of wafer 28 to each of the aberration content sets. The response of wafer 28 to the lens aberrations may be used to determine locations of the pattern that are sensitive to aberration. For example, the variation among given aberration content sets may be used to determine the variation of lens aberrations among different projection lenses 22 or across the lens field of a projection lens 22. This information may be used to select ranges of values for the Zernike coefficients to describe the variation of lens aberrations that may affect the desired pattern. The predicted change in a critical dimension of the pattern for a randomly generated collection of Zernike coefficients with the same range may be compared to the corresponding critical dimension control requirement to gauge the aberration sensitivity.

Correction module 136 may be used to perform proximity correction for a pattern design of mask 26 in order to compensate for lens aberrations. Correction module 136 may receive aberration content that describes the lens aberrations of exposure tool 10. The optical model may be used to determine an error resulting from the aberrations. Correction module 136 may correct the mask design to compensate for the error by performing an optical proximity correction procedure using any suitable optical proximity correction software.

For example, if the optical model predicts a critical dimension for a feature to be smaller by five nanometers in the presence of lens aberrations, correction software of correction module 126 may modify the target layer for the optical proximity correction to be five nanometers larger for the feature. Conventional correction software may then modify the mask database so that the wafer level critical dimension is corrected in accordance with the lens aberrations. According to one embodiment, the optical model may be integrated into the conventional optical proximity correction model, so that the proximity correction of the mask may be made in accordance with the lens aberrations.

Client 120 and server 124 may each operate on one or more computers, and may include appropriate input devices, output devices, mass storage media, processors, memory, or other components for receiving, processing, storing, and communicating information according to the operation of system 110. As used in this document, the term "computer" refers to any suitable device operable to accept input, process the input according to predefined rules, and produce output, for example, a personal computer, work station, network computer, wireless telephone, personal digital assistant, one or more microprocessors within these or other devices, or any other suitable processing device.

Client 120 and server 124 may be integrated or separated according to particular needs. For example, the present invention contemplates the functions of both client 120 and server 124 being provided using a single computer system, for example, a single personal computer. If client 120 and server 124 are separate, client 120 may be coupled to server 124 using one or more local area networks (LANs), metropolitan area networks (MANs), wide area networks (WANs), a global computer network such as the Internet, or any other appropriate wire line, wireless, or other links.

A database 128 stores data that may be used by server 24. Database 128 may be local to or remote from server 24, and may be coupled to server 24 using one or more local area networks (LANs), metropolitan area networks (MANs), wide area networks (WANs), a global computer network such as the Internet, or any other appropriate wire line, wireless, or other links.

Database 128 may include, for example, collected data 140 and results 142. Collected data may include, for example, lens aberration data, aberration content, a pattern design, other suitable data, or any combination of the preceding. Lens aberration data may indicate wafer response to lens aberrations. Aberration content may describe the aberrations of a lens. A pattern design may describe the design of mask 26 for forming a pattern.

Modifications, additions, or omissions may be made to system 110 without departing from the scope of the invention. Moreover, the operation of system 110 may be performed by more or fewer modules. For example, the operation of data collector 130 and optical model generator 132 may be performed by one module, or the operation of optical model generator 132 may be performed by more than one module. Additionally, functions may be performed using any suitable logic comprising software, hardware, other logic, or any suitable combination of the preceding.

According to other techniques, correcting a pattern design for errors due to lens aberrations may require the actual production of a sacrificial mask. The sacrificial mask is used to expose a wafer, and the resulting pattern is examined to identify errors. The design for the sacrificial mask is corrected to generate a new mask, which is used to pattern wafers. System 110 may generate an optical model that may be used to correct a design to compensate for errors due to lens aberrations without producing a sacrificial mask.

FIG. 3 is a flowchart illustrating one embodiment of a method for generating an optical model. The method begins at step 200, where a lens aberration of projection lens 22 is adjusted in order to collect lens aberration data. The lens aberration may be adjusted by moving one or more lens elements of projection lens 22. Wafer 28 is then exposed. The response of wafer 28 to the adjustment is determined at step 210. Lens aberration data describing the response of wafer 28 is collected at step 212.

Optical model generator 132 selects aberration functions 214 that may be used to describe the lens aberration data. The aberration functions may comprise Zernike functions, and may be selected by determining which aberration function best describes the lens aberration data. The selected aberration functions are fit to the data at step 216. Typically, the aberration functions may be fit to the data by adjusting the coefficients of the functions until the functions describe the data. An optical model is generated using the aberration functions at step 218. The optical model may be used to describe how wafer 28 responds to lens aberrations of projection lens 22. The optical model may also describe the response of wafer 28 to other features of exposure tool 10.

The optical model generated at step 218 may be used to perform one or more procedures. As an example, the optical model may be used to perform a sensitivity procedure or correction procedure at step 220. If a sensitivity procedure is to be performed, the method proceeds to step 224. Aberration content sets describing the aberration content of a number of exposure tools 10 are received by sensitivity checker 134 at step 224.

Wafer responses to the aberrations of the exposure tools 10 are determined at step 226. The wafer responses may be determined by simulating the responses using the optical model. The sensitivity of the design to the aberrations is determined at step 228. The sensitivity may be determined by comparing the wafer responses to the different exposure tools 10. After determining the sensitivity, the method proceeds to step 270.

If the correction procedure is to be performed at step 220, the method proceeds to step 240. A proximity correction of the design is estimated at step 240. The proximity correction may be estimated using any suitable optical proximity correction software. Aberration content for an exposure tool 10 is received at step 242 the aberration content may describe lens aberrations of exposure tool 10. The sensitivity of the design to the aberration content is assessed at step 246 to identify errors.

If the errors are correctable at step 248, the method proceeds to step 250, where a correction is performed. If the correction is not satisfactory at step 252, the method may return to step 240 to estimate a next proximity correction of the design in order to generate an improved correction. If the correction is satisfactory at step 252, the method proceeds to step 270. If the error is not correctable at step 248, the method proceeds to step 260, where correction module 136 indicates that the error is not correctable. The method then proceeds to step 270.

Results are reported at step 270. The results may include the corrected design and any analysis performed using the optical model. After reporting the results, the method terminates.

Modifications, additions, or omissions may be made to the method without departing from the scope of the invention. Additionally, steps may be performed in any suitable order without departing from the scope of the invention.

Certain embodiments of the invention may provide one or more technical advantages. A technical advantage of one embodiment may be that an optical model may describe how a lens aberration of an exposure tool affects the pattern defined on a wafer. According to another embodiment, the optical model may be used to determine the sensitivity of a pattern design with respect to the lens aberrations of multiple exposure tools. According to yet another embodiment, the optical model may be used to adjust a pattern design to correct an error resulting from a lens aberration.

Although an embodiment of the invention and its advantages are described in detail, a person skilled in the art could make various alterations, additions, and omissions without departing from the spirit and scope of the present invention as defined by the appended claims.

What is claimed is:

1. A method for generating an optical model, comprising:
   adjusting a lens aberration of one or more lens aberrations of an initial lens;
   determining a wafer response to the adjustment;
   generating lens aberration data according to the wafer response;
   selecting one or more aberration functions of a plurality of aberration functions;
   fitting the one or more aberration functions to the lens aberration data; and
   generating an optical model in accordance to the one or more aberration functions, the optical model indicating the wafer response to the one or more lens aberrations of the initial lens.

2. The method of claim 1, wherein the plurality of aberration functions comprise a plurality of Zernike functions.

3. The method of claim 1, further comprising:
   receiving a plurality of aberration content sets associated with a plurality of exposure tools, each aberration content set describing one or more lens aberrations associated with a lens of an exposure tool of the one or more exposure tools;
   receiving a pattern design comprising one or more locations;
   applying the optical model to the pattern design according to each aberration content set to generate response data for each aberration content set; and
   determining a sensitivity of the one or more locations of the pattern design to the one or more lens aberrations associated with the plurality of exposure tools in accordance with the response data.

4. The method of claim 1, further comprising:
   receiving aberration content describing one or more lens aberrations associated with a lens;
   applying the optical model to a pattern design according to the aberration content to identify an error; and
   performing a proximity correction for the error.

5. The method of claim 1, further comprising:
   performing an estimated proximity correction for a pattern design;
   receiving aberration content describing one or more lens aberrations associated with a lens of an exposure tool;
   applying the optical model to the pattern design according to the aberration content to identify an error;
   performing a proximity correction for the error if the error is correctable; and
   identifying the error as uncorrectable otherwise.

6. A system for generating an optical model, comprising:
   a database operable to store lens aberration data associated with a wafer response to one or more lens aberrations of an initial lens; and
   a server coupled to the database and operable to:
      adjust a lens aberration of the one or more lens aberrations;
      determine the wafer response to the adjustment;
      generate the lens aberration data according to the wafer response;
      select one or more aberration functions of a plurality of aberration functions;
      fit the one or more aberration functions to the lens aberration data; and
      generate an optical model in accordance to the one or more aberration functions, the optical model indicating the wafer response to the one or more lens aberrations of the initial lens.

7. The system of claim 6, wherein the plurality of aberration functions comprise a plurality of Zernike functions.

8. The system of claim 6, wherein:
   the database is further operable to:
      receive a plurality of aberration content sets associated with a plurality of exposure tools, each aberration content set describing one or more lens aberrations associated with a lens of an exposure tool of the one or more exposure tools;
      receive a pattern design comprising one or more locations; and
   the server is further operable to:
      apply the optical model to the pattern design according to each aberration content set to generate response data for each aberration content set; and
      determine a sensitivity of the one or more locations of the pattern design to the one or more lens aberrations associated with the plurality of exposure tools in accordance with the response data.

9. The system of claim 6, wherein:
   the database is further operable to receive aberration content describing one or more lens aberrations associated with a lens; and
   the server is further operable to:
      apply the optical model to a pattern design according to the aberration content to identify an error; and
      perform a proximity correction for the error.

10. The system of claim 6, wherein:
    the database is further operable to receive aberration content describing one or more lens aberrations associated with a lens of an exposure tool; and the server is further operable to:
perform an estimated proximity correction for a pattern design;
apply the optical model to the pattern design according to the aberration content to identify an error;
perform a proximity correction for the error if the error is correctable; and
identify the error as uncorrectable otherwise.

11. Logic for generating an optical model, the logic embodied in a medium and operable to:
adjust a lens aberration of one or more lens aberrations of an initial lens;
determine a wafer response to the adjustment;
generate lens aberration data according to the wafer response;
select one or more aberration functions of a plurality of aberration functions;
fit the one or more aberration functions to the lens aberration data; and
generate an optical model in accordance to the one or more aberration functions, the optical model indicating the wafer response to the one or more lens aberrations of the initial lens.

12. The logic of claim 11, wherein the plurality of aberration functions comprise a plurality of Zernike functions.

13. The logic of claim 11, further operable to:
receive a plurality of aberration content sets associated with a plurality of exposure tools, each aberration content set describing one or more lens aberrations associated with a lens of an exposure tool of the one or more exposure tools;
receive a pattern design comprising one or more locations;
apply the optical model to the pattern design according to each aberration content set to generate response data for each aberration content set; and
determine a sensitivity of the one or more locations of the pattern design to the one or more lens aberrations associated with the plurality of exposure tools in accordance with the response data.

14. The logic of claim 11, further operable to:
receive aberration content describing one or more lens aberrations associated with a lens;
apply the optical model to a pattern design according to the aberration content to identify an error; and
perform a proximity correction for the error.

15. The logic of claim 11, further operable to:
perform an estimated proximity correction for a pattern design;
receive aberration content describing one or more lens aberrations associated with a lens of an exposure tool;
apply the optical model to the pattern design according to the aberration content to identify an error;
perform a proximity correction for the error if the error is correctable; and
identifying the error as uncorrectable otherwise.

16. A system for generating an optical model, comprising:
means for adjusting a lens aberration of one or more lens aberrations of an initial lens;
means for determining a wafer response to the adjustment;
means for generating lens aberration data according to the wafer response;
means for selecting one or more aberration functions of a plurality of aberration functions;
means for fitting the one or more aberration functions to the lens aberration data; and
means for generating an optical model in accordance to the one or more aberration functions, the optical model indicating the wafer response to the one or more lens aberrations of the initial lens.

17. A method for generating an optical model, comprising:
adjusting a lens aberration of one or more lens aberrations of an initial lens;
determining a wafer response to the adjustment;
generating a lens aberration data according to the wafer response;
receiving the lens aberration data associated with the wafer response to the one or more lens aberrations of the initial lens;
selecting one or more aberration functions of a plurality of aberration functions, the plurality of aberration functions comprising a plurality of Zernike functions;
fitting the one or more aberration functions to the lens aberration data;
generating an optical model in accordance to the one or more aberration functions, the optical model indicating the wafer response to the one or more lens aberrations of the initial lens;
receiving a plurality of aberration content sets associated with a plurality of exposure tools, each aberration content set describing one or more lens aberrations associated with a lens of an exposure tool of the one or more exposure tools;
receiving a first pattern design comprising one or more locations;
applying the optical model to the first pattern design according to each aberration content set to generate response data for each aberration content set; and
determining a sensitivity of the one or more locations of the first pattern design to the one or more lens aberrations associated with the plurality of exposure tools in accordance with the response data;
performing an estimated proximity correction for a second pattern design;
receiving aberration content describing one or more lens aberrations associated with a lens of an exposure tool;
applying the optical model to the second pattern design according to the aberration content to identify an error;
performing a proximity correction for the error if the error is correctable; and
identifying the error as uncorrectable otherwise.

* * * * *